United States Patent
Nehrig et al.

(10) Patent No.: US 8,415,956 B2
(45) Date of Patent: Apr. 9, 2013

(54) ELECTRONIC DEVICE AND METHOD FOR WIRE CHECK

(75) Inventors: Oliver Nehrig, Kirchdorf a.d. Amper (DE); Adolf Baumann, Haag (DE); Ralph Ledwa, Halblech/Buching (DE)

(73) Assignee: Texas Instruments Deutschland GmbH, Freising (DE)

( * ) Notice: Subject to any disclaimer, the term of this patent is extended or adjusted under 35 U.S.C. 154(b) by 675 days.

(21) Appl. No.: 12/645,029

(22) Filed: Dec. 22, 2009

(65) Prior Publication Data

US 2010/0156433 A1   Jun. 24, 2010

(30) Foreign Application Priority Data

Dec. 23, 2008   (DE) .......................... 10 2008 062 929

(51) Int. Cl.
G01R 31/08   (2006.01)
G01R 31/04   (2006.01)

(52) U.S. Cl.
USPC ......................................... 324/525; 324/537

(58) Field of Classification Search ........................ None
See application file for complete search history.

(56) References Cited

U.S. PATENT DOCUMENTS

| 3,729,638 | A | * | 4/1973 | Macrander | 327/594 |
| 5,054,050 | A | * | 10/1991 | Burke et al. | 379/26.02 |
| 2002/0005520 | A1 | | 1/2002 | Mochizuki et al. | |

FOREIGN PATENT DOCUMENTS

DE   69033792   5/2002

OTHER PUBLICATIONS

DE Search Report, (Dec. 2008, six pages).

* cited by examiner

*Primary Examiner* — Paresh Patel
(74) *Attorney, Agent, or Firm* — William B. Kempler; Wade J. Brady, III; Frederick J. Telecky, Jr.

(57) ABSTRACT

An electronic device is provided, which includes a current supplying stage which is adapted to supply a first compensation current and a second compensation current to a first wire or a second wire, wherein the first compensation current is determined during a first clock period, when the first wire and the second wire are connected. The second compensation current is determined during a second clock period while the first wire and the second wire are not connected and the magnitude of the second current represents a ratio of a resistance value of the first wire and a resistance value of the second wire.

10 Claims, 1 Drawing Sheet

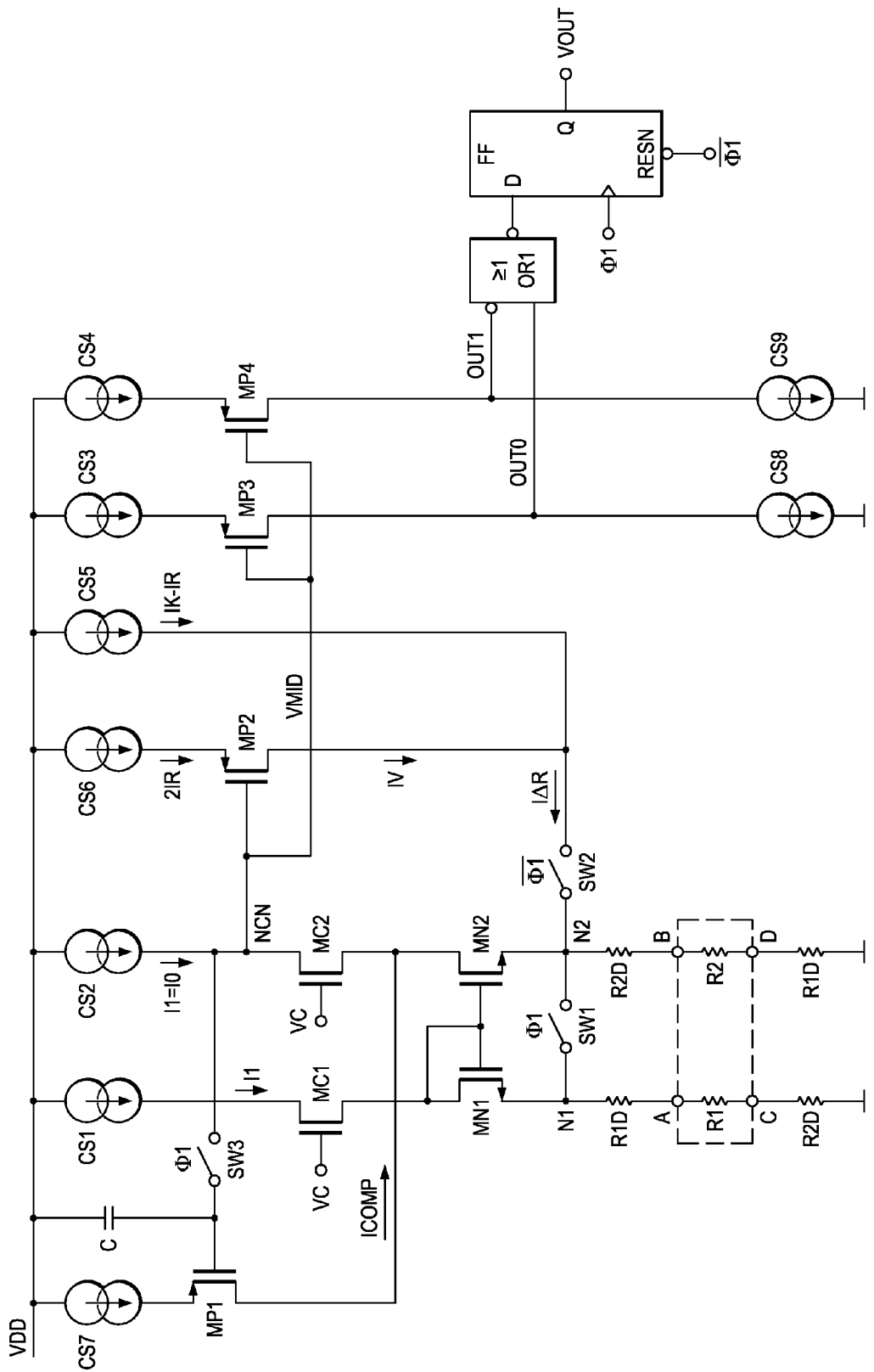

ELECTRONIC DEVICE AND METHOD FOR WIRE CHECK

CROSS-RELATED APPLICATIONS

This patent application claims priority from German Patent Application No. 10 2008 062 929.4, filed Dec. 23, 2008, the entirety which is incorporated herein by reference.

FIELD OF INVENTION

The invention generally relates to an electronic device and a method for checking wires, more specifically, the present invention relates to an electronic device and a method for monitoring the resistance of wires.

BACKGROUND OF THE INVENTION

Deficient interconnecting wires in electronic devices, in particular in integrated semiconductor circuits due, for example, to wire cuts, layout deficiencies or deviations from average parasitic resistance values of wires can cause errors and failure of important electronic functions. Therefore, it is generally important to detect deficiencies in integrity of interconnecting wires. Conventional solutions are generally based on functionality tests of the whole electronic device. These tests are typically performed once during manufacturing, production of assembly. If an electronic device fails a test, it will be sorted out. However, during normal operation, a deficient wire may remain undetected as long as the failure does not generally affect the used function. Furthermore, the specific kind of wire disturbance as, for example, short circuits, wire cuts, or inadmissible parasitic resistances, can not be determined.

SUMMARY OF THE INVENTION

It is a general object of the present invention to provide an electronic device and a method for detecting wire deficiencies during operation of the electronic device.

In accordance with one aspect of the invention, a electronic device is provided which comprises a current supplying stage. The current supplying stage is adapted to supply a first compensation current and a second compensation current to a first wire or a second wire. The first compensation current is determined during a first clock period, when the first wire and the second wire are connected. The second compensation current is determined during a second clock period while the first wire and the second wire are not connected and the magnitude of the second current represents a ratio of a resistance value of the first wire and a resistance value of the second wire. The resistance values may have a specific mismatch, but they may also be infinite due to broken wires or zero due to short circuits.

In an embodiment of the invention, the current supplying stage comprises a first current source for supplying a first constant current to a first wire at a first node, and a second current source for supplying a second constant current to a second wire at a second node. Furthermore, there may be a current mirror with a first transistor coupled between the first node and the first wire and a second transistor coupled between the second node and the second wire. The electronic device may further comprise a first switch coupled to connect the first wire and the second wire at a side of the current mirror opposite to the first and second current source during a first clock period. A third current source is provided which is adapted to supply the first compensation current to the first or second wire for compensating an offset (e.g. an offset of the current supplying stage) during the first clock period. A fourth current source and a second switch are coupled to supply a second compensation current to the first or second wire during a second clock period (when the first switch is open) for compensating a difference of the resistance of the first wire and the resistance of the second wire. The first compensation current is maintained and also supplied to the first wire or the second wire during the second clock period. A control signal is coupled to control the magnitude of the second compensation current. The control signal is fed to an output stage which is adapted to indicate a ratio of the resistance of the first wire and the resistance of the second wire in response to the control signal.

In accordance with an aspect of the invention, the electronic device is adapted to use a first compensation current to compensate any unbalance due to production spread, temperature etc. of the current supplying stage. The unbalance or offset may be caused by the current sources, the current mirror or other components or interconnections coupled to the first and second wire. Therefore, the wires are connected at one side, such that they represent only a single resistance to the current supplying stage. This step can be regarded as a calibration step for the current supplying stage. In a second step, the wires are disconnected and a second compensation current is supplied to one of the wires to compensate the difference of the resistance values of the wires. The control signal that controls the magnitude of the second compensation current carries the information of the difference of the resistance values and can advantageously be further processed in the output stage to generate an output signal indicating the resistance ratio.

In an aspect of the invention, there is a component coupled between the second node and the current mirror, which generates a voltage drop in response to a current. In particular, this component may be a cascode transistor, which is coupled with its channel between the second node and the current mirror. With the component between the current source and the current mirror, a control node is provided between the output of the second current source and the component. A control input of the third current source may then be coupled to the control node. According to this aspect of the invention, a voltage drop across a component, as, for example, a cascode transistor, is used for controlling the third current source. The third current source produces the first compensation current for compensating offsets or any other unbalance between the two current paths relating to the first and second wires.

Furthermore, a capacitor may be coupled to the control input of the third current source for buffering the control signal during the second clock period. This allows the voltage level at the control input of the third current source to be maintained during the second clock period, when the second compensation current is determined for compensating the difference of the resistances of the first wire and the second wire. The control input of the third current source may be a gate of MOSFET. The third current source may then be implemented as a combination of a constant current source (e.g. a current mirror) coupled in series with the MOSFET, the gate of which is controlled.

A fifth current source may be coupled in parallel to the forth current source so as to contribute a constant current to the second compensation current. The current of the fifth current source may be a function of the current of the first current source and the expected ratio of the resistance of the first wire and the resistance of the second wire. In this aspect of the invention, the second compensation current may be split into two parts, a constant part and a variable part.

Thereby, a rather simple and robust implementation of a current source for the second compensation current can be provided. The second compensation current may then be varied around a fixed (i.e. constant) value and within a predetermined range. This range can then preferably be symmetric around the fixed (constant) value.

In an embodiment of the invention, the evaluation stage may include a first current path and a second current path. The first current path may have a sixth current source and a seventh current source coupled in series. The second current path may include an eighth current source and a ninth current source, which are also coupled in series. The sixth and eighth current sources may be variable current sources and the control gates of these variable current sources may be coupled to the control node in order to receive the control signal. In each current path, an output node is provided between the variable and the constant current source. These two nodes assume voltage levels in accordance with the received control signal. In an embodiment, the variable current sources, i.e. the transistors used to control the currents, may have different dimensions. Between the sixth current source and the seventh current source a first output node may be provided. Between the eighth current source and the ninth current source a second output node may provided.

In another embodiment of the invention, the evaluation stage may include a first current path and a second current path. The first current path may have a sixth current source coupled in series with the channel of a MOSFET. The second current path may include an eighth current source coupled in series with the channel of a MOSFET. The sixth and eighth current sources may be current sources having currents of $(1-x)$ times a predefined current and $(1+x)$ times the same predefined current value, respectively. The control gates of these MOSFETs may be coupled to the control node in order to receive the control signal. In each current path, an output node is provided between the current sources and the respective MOSFET channels. The two nodes assume voltage levels in accordance with the received control signal. The MOSFET transistors advantageously have equal dimensions, i.e. they are matched. Furthermore, they may be matched with a MOSFET used to control the second compensation current.

The voltage levels and the output nodes may then be evaluated by logic circuitry such that the final output signal of the evaluation stage may indicate in a rather simple manner whether or not the ratio of the resistance of the first wire and the resistance of the second wire is within an admissible range.

Furthermore, a flip-flop and an OR-gate may be provided. The OR-gate may be coupled with the first input to the first output node and with the second input to the second output node. An output of the OR-gate may be coupled to an input of the flip-flop. The flip-flop may be reset during the first clock period and updated during the second clock period. The OR-gate and the flip-flop may then represent a simple logic for evaluating the voltage levels at the first and the second output node representing the detected and evaluated ratio of the resistances of the first wire and the second wire.

A first resistor may be coupled between the current mirror and a first side of the first wire and the second resistor may be coupled between the second side of the first wire. Furthermore, a third resistor may be coupled between the current mirror and the first side of the second wire and a fourth resistor may be coupled to a second side of the second wire. The first and the fourth resistors and the second and the third resistors may have the same resistances. Furthermore, some of the resistances of the first resistor and the second resistor maybe chosen greater than the resistance of the first wire and some of the resistances of the third and fourth resistors may be greater than resistance of the second wire. According to this aspect of the invention, it is possible to detect short circuits and wire cuts of the two wires.

The present invention also provides a method. According to an aspect of the invention, this method a first compensation current and a second compensation current are supplied to a first wire and/or a second wire. The first compensation current is determined during a first clock period, when the first wire and the second wire are connected. The second compensation current is determined during a second clock period while the first wire and the second wire are not connected and the magnitude of the second current represents a difference of a resistance of the first wire and a resistance of the second wire. The second compensation current is used as an indicator of a ratio of the resistance value of the first wire and the resistance value of the second wire. A ratio of a resistance of the first wire and a resistance of the second wire can be determined. The first wire may be supplied with a first current and the second wire may be supplied with a second current from a current supplying stage. A current may be mirrored from the first wire to the second wire. The first wire and the second wire can then be connected at a first side during the first clock period. During the first clock period the first compensation current is determined and supplied to a current path relating to either the first or the second wire. Further, the first wire and the second wire are disconnected during a second clock period and a second compensation current may be supplied to a current path relating to the first or second wire for compensating a difference of the resistance of the first wire and the resistance of the second wire. The second compensation current may be determined with a control signal. This control signal may then be used as an indicator of the ratio of the resistance of the first wire and the resistance of the second wire.

BRIEF DESCRIPTION OF DRAWING

Further aspects of the invention will ensue from the following description of a preferred embodiment of the invention with reference to the accompanying drawing wherein:

FIG. 1 shows a simplified circuit diagram of an embodiment of the present invention.

DETAILED DESCRIPTION OF PREFERRED EMBODIMENT

Referring to FIG. 1, a first wire is coupled between nodes A and C. The first wire is represented by a resistor R1. A second wire is coupled between nodes B and D. The second wire is represented by a resistor R2. A first current source CS1 supplies a constant current I1 through cascode transistor MC1 and current mirror MN1, MN2 to node N1. A second current source CS2 supplies a constant current I1=I0 through cascode transistor MC2 and the second transistor MN2 of current mirror MN1, MN2 to node N2. A series of a resistor R1D, wire R1 (represented by a resistor) and resistor R2D is coupled to the first node N1. A series of a resistor R2D, wire R2 (represented by a resistor) and resistor R1D is coupled to the second node N2.

The first wire R1 is coupled to node N1 through resistor R1D and to ground through R2D. The second wire R2 is coupled to node N1 through resistor R1D and to ground through R2D. There is a current source CS7 forming together with transistor MP1 a third current source controlled through the control gate of transistor MP1. The control gate of MP1 can be coupled to control node NCN through switch SW3.

The output of the third current source formed by CS7 and MP1 is coupled to the drain of transistor MN2 of the current mirror MN1, MN2. The third current source CS7, MP1 is adapted to supply a first compensation current ICOMP to the drain of transistor MN2. There is a buffer capacitor C coupled between supply voltage level VDD and the control gate of transistor MP1 for buffering the control voltage level at the control gate of MP1. There are further current sources CS6 and CS5 for providing the second compensation current IΔR through switch SW2 to node N2. Switch SW1 is coupled between nodes N1 and N2 in order to connect one side of wires R1 and R2. Transistor MP2 and current source CS6 form a fourth variable current source which is controlled through the control gate of transistor MP2. The control gate of MP2 is coupled to control node NCN. Current source CS5 provides a constant current of a magnitude of IK−IR. The magnitude of the fourth variable current source CS6, MP2 can be varied from 0 to 2*IR. Furthermore, there is an evaluation stage including current sources CS3, CS4, CS8, CS9 and transistors MP3 and MP4. Furthermore, there is an OR-gate OR1 and a flip flop FF. A first current path includes current source CS3, transistor MP3 and current source CS8 and a second current path includes a series of current source CS4, transistor MP4 and current source CS9. Transistor MP3 and current source CS3 may be considered as a variable current source. Current source CS4 and transistor MP4 may also be considered as a variable current source. The two variable current sources CS3, MP3 and CS4, MP4 are controlled through the control gates of the transistors MP3 and MP4. The control gates are coupled to control node NCN. Between the drains of transistors MP3 and MP4 and respective current sources CS8 and CS9 to output nodes OUT0 and OUT1 are provided. These output nodes are coupled to respective inputs of the OR-gate OR1. The output of the OR-gate OR1 is coupled to an input (data-input) of flip-flop FF. Flip-flop FF clocked with first clock signal Φ1 and reset with the inverted first clock signal. In an embodiment CS6, CS3 and CS4 can be omitted and transistors MP2, MP3 and MP4 can be matched.

The circuit shown in FIG. 1 can detect mismatch or unbalance between the two wires represented by resistors R1 and R2. In particular, the difference of the resistance values of wire R1 and wire R2 can be determined on in other words, it can be determined whether or not the mismatch or difference is within an admissible range. In order to compensate the mismatch of, for example, transistors MN1 and MN2 of the current mirror, nodes N1 and N2 are short circuited through switch SW1 during a first clock period Φ1. During the first clock period Φ1 (i.e. SW1 is closed=conducting), transistor MP1 controls the control voltage level at node NCN to approximately VDD/2 by supplying a compensation current ICOMP to the channel of transistor MN2. This provides that the quotient ID/VT (ID being the drain current and VT the threshold voltage level of MN1) of MN1 and MN2 are identical. Any offset or unbalance of the two current paths relating to the two wires R1, R2 are leveled out during the first clock period while the wires R1 and R2 are connected. By use of buffer capacitor C, the control voltage level of node NCN is preserved on the control gate of MP1 while switch SW3 is open (not conducting). Therefore, the magnitude of compensation current ICOMP is maintained during the second clock period. The output of flip-flop FF is set to 0. During the second clock period, switches SW1 and SW3 are opened (not conducting) and switch SW2 is closed (conducting). Therefore, the resistance values in nodes N1 and N2 depend on the resistances R1 and R2 of the wires and the resistors R1D and R2D. Each current path includes a series of resistors R1D and R2D. These resistors are dimensioned according to the following rules R1D>>R2D (R1D is much greater than R2D) and R1D+R2D<R1 and R1D+R2D<R2. This means that the wire resistances R1, R2 are dominant. The current IER includes a variable part IV and a constant part IK−IR. The maximum magnitude of IV is 2*IR. Furthermore, the current IK should be dimensioned as follows:

The gate voltages $V_{G,MN1}$ and $V_{G,MN2}$ are $$V_{G,MN1} = V_{GS,MN1} + V_{R1} = V_{GS,MN1} + I_{D,MN1}*R1 \quad (1)$$

$$V_{G,MN2} = V_{GS,MN2} + V_{R2} = V_{GS,MN2} + (I_{D,MN2}+IK)*R2 \quad (2)$$

wherein $V_{R1}$ and $V_{R2}$ are the voltage drops across wires R1 and R2. Currents $I_{D,MN1}$ and $I_{D,MN2}$ are the respective drain currents of transistors MN1 and MN2. Voltage drops across resistors R1D and R2D are neglected since R1 and R2 are dominant. It is assumed that gate source voltages and gate voltages of MN1 and MN2 are equal:

$$V_{GS,MN1} = V_{GS,MN2} \text{ and } V_{G,MN1} = V_{G,MN2} \quad (3)$$

It follows that $$I_{D,MN1}*R1 = (I_{D,MN2}+IK)*R2, \quad (4)$$

and the ratio R1/R2 is $$\frac{R1}{R2} = \frac{I_{D,MN1}}{I_{D,M}} \quad (5)$$

For known currents $I_{D,MN1} = I_{D,MN2} = I1$ (6)

Current IK is $$IK = \left(\frac{R1}{R2} - 1\right) \times I1 \quad (7)$$

If R1=R2 then IK=0. For wires having different resistance values, a respective current IK can be set. R2 should be smaller than R1. Generally, current IΔR is split in a fixed and a variable part. This allows the control range to be limited. The maximum allowed mismatch between the first and the second wire R1, R2 can be set. The variable part of current IΔR remains between IK+IR and IK−IR. The output transistors MP3 and MP4 are dimensioned such that they have different channel width to channel length ratios (W/L ratio). A possible choice is $$\left(\frac{W}{L}\right)_{MP3} = N^2\left(\frac{W}{L}\right) \quad (8)$$

However, in an embodiment, transistors MP3 and MP4 may have the same dimensions as transistor MP2. This means that current IV is mirrored to the output paths the same. MP3 and MP4 are configured to have the same current IV flowing through their channels. Current sources CS6, CS3 and CS4 may be omitted and the currents through current sources CS8 and CS9 may then be set to (1−x) IR (for CS8) and (1+x) IR (for CS9). With matched transistors MP2, MP3, MP4 and the respective configuration for the currents of CS8 and CS9, the admissible range of (1−x)IR to (1+x)IR can be better controlled than by channel length variation of MP3 and MP4. Furthermore, omitting CS6, CS4 and CS3 improves matching of MP3, MP4 and MP2.

All current sources can be simple current sources (implemented through current mirrors) or they may include cascode transistors in order to improve their performance.

The following table indicates the different situations depending on the resistance values R1 and R2.

| Condition | $I_{D,MP2}$ | OUT0 | OUT1 | VOUT at |
|---|---|---|---|---|
| M + V > R1/R2 > M − V | $0 < I_{D,MP2} < 2 * IR$ | 0 | 1 | 1 |
| R1/R2 > M | 2 * IR | 1 | 1 | 0 |
| R1/R2 < M | 0 | 0 | 0 | 0 |
| R1 = 0 AND R2 = 0 | 0 | 0 | 0 | 0 |
| R1 = 0 (Short A->C) | 0 | 0 | 0 | 0 |
| R2 = 0 (Short B->D) | 2 * IR | 1 | 1 | 0 |
| R1 = ∞ | 2 * IR | 1 | 1 | 0 |
| R2 = ∞ | 0 | 0 | 0 | 0 |
| Short A -> B | 2 * IR | 1 | 1 | 0 |
| Short C -> D | 0 | 0 | 0 | 0 |
| Short A/C -> GND | 0 | 0 | 0 | 0 |
| Short B/D -> GND | $I_{D,MP2}$ | 1 | 1 | 0 |
| Short A/C -> VDD | $I_{D,MP2}$ | 1 | 1 | 0 |
| Short B/D -> VDD | 0 | 0 | 0 | 0 |

M is the designated resistance ratio R1/R2. V is the allowed mismatch variation (e.g. a percentage of admissible variation). A, B, C and D are nodes shown in FIG. 1. Short A→B means a short circuit between node A and node B. Short A/C→GND indicates a short circuit between node A and GND and node C and GND.

The circuit according to the embodiment of the present invention allows short circuited or broken wires to be detected. Furthermore, it is possible to detect any external manipulation on the first and the second wire. Also any connection to ground can be detected. Furthermore, the circuit according to the embodiment of the invention has a very small current consumption and is particularly useful for monitoring wires with very small resistance values (e.g. copper wires).

An embodiment of the present invention has been explained above. The present invention, however, is not limited to said embodiment. Various kinds of modifications, substitutions and alterations can be made within the scope of the technical idea of the present invention as defined by the appended claims.

The invention claimed is:

1. An electronic device comprising:
a current supplying stage which is adapted to supply a first compensation current and a second compensation current to a first wire or a second wire, wherein the first compensation current is determined during a first clock period, when the first wire and the second wire are connected, the second compensation current is determined during a second clock period while the first wire and the second wire are not connected and the magnitude of the second current represents a ratio of a resistance value of the first wire and a resistance value of the second wire.

2. The electronic device according to claim 1, wherein the current supplying stage comprises:
a first current source for supplying a first constant current to the first wire at a first node:
a second current source for supplying a second constant current to the second wire at a second node;
a current mirror comprising a first transistor coupled between the first node and the first wire and a second transistor coupled between the second node and the second wire;
a first switch coupled to connect the first wire and the second wire at a side of the current mirror opposite to the first and second current source during a first clock period;
a third current source adapted to supply the first compensation current to the second wire for compensating an offset of the current supplying stage determined during the first clock period; and
a fourth current source and a second switch coupled to supply the second compensation current to the second wire during a second clock period when the first switch is open for compensating a mismatch of the resistance of the first wire and the resistance of the second wire, wherein a control signal used to control the magnitude of the second compensation current is fed to an output stage which is adapted to indicate a ratio of the resistance of the first wire and the resistance of the second wire in response to the control signal.

3. The electronic device according to claim 2, wherein a component for generating a voltage drop, in particular, a cascode transistor, is coupled between the second node and the current mirror so as to provide a control node between the output of the second current source and the component, and a control input of the third current source is coupled to the control node.

4. The electronic device according to claim 2, further comprising a capacitor coupled to the control input of the third current source for buffering the control signal during the second clock period.

5. The electronic device according to claim 2, further comprising a fifth current source coupled in parallel to the fourth current source so as to provide a constant current to the second compensation current, wherein the current of the fifth current source is a function of the current of the first current source and the expected ratio of the resistance of the first wire and the resistance of the second wire.

6. The electronic device according to claim 2, comprising an evaluation stage comprising a first current path having a sixth current source and a transistor coupled with its channel in series at a first output node and a second current path having an eighth current source and a transistor coupled with its channel in series at a second output node, wherein the sixth current source is configured to provide a current (1−x) times a preset current and the eighth current source is configured to provide a current (1+x) times the preset current, with x<1, and the two transistors are matched.

7. The electronic device according to claim 6, wherein the evaluation stage further comprises a flip-flop and an OR gate coupled with a first input to the first current path, with a second input to the second current path and with an output to an input of the flip-flop.

8. The electronic device according to claim 2, comprising a first resistor coupled between the current mirror and a first side of the first wire and a second resistor coupled to a second side of the first wire and a third resistor coupled between the current mirror and a first side of the second wire and a fourth resistor coupled to a second side of the second wire, wherein the first and fourth resistor and the second and the third resistor have substantially the same resistance.

9. The electronic device according to claim 8, wherein the sum of the resistance values of the first resistor and the second resistor is greater than the resistance value of the first wire, and the sum of the resistance values of the third resistor and the fourth resistor is greater than the resistance value of the second wire.

10. The method of determining a ratio of a resistance value of a first wire and a resistance value of a second wire, the method comprising: supplying a first compensation current and a second compensation current to the first wire and/or the second wire, determining the first compensation current during a first clock period, when the first wire and the second wire are connected, determining the second compensation current during a second clock period while the first wire and the second wire are not connected, using the magnitude of the second current as an indicator of a ratio of a resistance value of the first wire and a resistance value of the second wire.

* * * * *